(12) United States Patent
Lin et al.

(10) Patent No.: US 10,594,018 B2
(45) Date of Patent: Mar. 17, 2020

(54) ANTENNA STRUCTURE OF A COMMUNICATIONS DEVICE

(71) Applicant: Quanta Computer Inc., Taoyuan (TW)

(72) Inventors: Hui Lin, Taoyuan (TW); Chun-I Lin, Taoyuan (TW); Hung-Ren Hsu, Taoyuan (TW); Jun-Yu Lu, Taoyuan (TW)

(73) Assignee: QUANTA COMPUTER INC., Guishan, Taoyuan (TW)

( * ) Notice: Subject to any disclaimer, the term of this patent is extended or adjusted under 35 U.S.C. 154(b) by 127 days.

(21) Appl. No.: 15/792,999

(22) Filed: Oct. 25, 2017

(65) Prior Publication Data
US 2019/0044215 A1 Feb. 7, 2019

(30) Foreign Application Priority Data
Aug. 3, 2017 (TW) .............................. 106126207 A (51) Int. Cl.
| | | |
|---|---|---|
| *H01Q 1/22* | (2006.01) | |
| *H05K 5/02* | (2006.01) | |
| *H01Q 3/44* | (2006.01) | |
| *G06F 1/16* | (2006.01) | |
| *H01Q 1/50* | (2006.01) | |
| *H01Q 1/24* | (2006.01) | |

(52) U.S. Cl.
CPC ......... *H01Q 1/2266* (2013.01); *G06F 1/1698* (2013.01); *H01Q 1/22* (2013.01); *H01Q 1/243* (2013.01); *H01Q 1/50* (2013.01); *H01Q 3/44* (2013.01); *H05K 5/02* (2013.01); *H05K 5/0247* (2013.01)

(58) Field of Classification Search
CPC ........ H01Q 1/2266; H01Q 1/22; H01Q 1/243; H01Q 1/526; H01Q 3/44; H01Q 1/50; H01P 11/00; H05K 5/0247; H05K 5/02; G06F 1/1698
USPC ........................................................ 343/702
See application file for complete search history.

(56) References Cited

U.S. PATENT DOCUMENTS 9,780,436 B2    1/2017  Lai et al.
2008/0036671 A1*  2/2008  Gonda ................ C04B 35/2633
                                                    343/787

(Continued)

FOREIGN PATENT DOCUMENTS

TW    201702789 A   1/2017
WO    2007/037494 A1 4/2007

OTHER PUBLICATIONS

Chinese language office action dated Nov. 20, 2018, issued in application No. TW 106126207.

*Primary Examiner* — Hai V Tran
(74) *Attorney, Agent, or Firm* — McClure, Qualey & Rodack, LLP (57) ABSTRACT

A communications device includes a system ground plane, a signal source, a device frame, a magnetic conductive material and an antenna. The signal source is electrically coupled to the system ground plane. The device frame is perpendicular to the system ground plane. The antenna is electrically coupled to the signal source and is disposed on the device frame. The magnetic conductive material is disposed adjacent to the antenna but spaced apart by a first predetermined distance from the antenna. The magnetic line of force induced by the antenna is directed in a predetermined direction by the magnetic conductive material.

8 Claims, 10 Drawing Sheets

(56) References Cited

U.S. PATENT DOCUMENTS

| | | | |
|---|---|---|---|
| 2008/0055178 A1* | 3/2008 | Kim | H01Q 1/38 343/787 |
| 2010/0171234 A1* | 7/2010 | Lee | B29C 48/04 264/129 |
| 2010/0257725 A1* | 10/2010 | Akiho | C01G 49/0018 29/600 |
| 2012/0091821 A1* | 4/2012 | Kato | H01Q 1/38 307/104 |
| 2014/0266923 A1* | 9/2014 | Zhou | H01Q 5/35 343/702 |
| 2015/0042528 A1* | 2/2015 | Jung | H01Q 1/526 343/787 |

\* cited by examiner

ANTENNA STRUCTURE OF A COMMUNICATIONS DEVICE

CROSS REFERENCE TO RELATED APPLICATIONS

This Application claims priority of Taiwan Patent Application No. 106126207 filed on Aug. 3, 2017, the entirety of which is incorporated by reference herein.

BACKGROUND OF THE INVENTION

Field of the Invention

The disclosure generally relates to an antenna structure, and more specifically, to an antenna structure for use in a communications device which can meet the requirement to have a narrow border, and which can maintain good antenna transmission performance.

Description of the Related Art

In existing communication devices, the placement of the antenna must be as far away as possible from the surrounding metal components in order to avoid the loss of electromagnetic waves caused by the metal components affecting the transmission efficiency of the antenna. In notebook computers, a more common way to place the antenna is to configure the antenna around the display module to avoid taking up space in the main circuit board, and to avoid interference by noise from the main circuit board.

The display module also contains metal components. Therefore, a sufficiently wide distance must be maintained between the antenna and the display module to ensure that the transmission efficiency of the antenna is less susceptible to the influence of the display module. However, such a width requirement limits the size of the visible area of the screen, which in turn affects user experience. In addition, while the demand for narrow-border (or, narrow-frame) electronic devices is also increasing, such width requirements are not conducive to the efficient design of narrow-border electronic devices.

To solve the above mentioned problem, novel antenna structures which can maintain good antenna transmission performance, and can further take into account the appearance of the electronic device and user experience are proposed.

BRIEF SUMMARY OF THE INVENTION

In order to solve the technical problem discussed above, the invention proposes novel methods for designing antenna structures that are suitable for use in a communications device. The antenna is disposed on the lateral surface of the communications device, so that the antenna does not have to occupy the circuit area on the main circuit board and so that it can be integrated with the housing of the full-metal back cover. In addition, a ferrite material is disposed between the LCD display panel and the antenna. In this manner, the original radiation characteristics of the antenna can be maintained even if the distance between the antenna and the LCD display panel is less than 3 mm. The proposed antenna structure is suitable for use in a communications device with a narrow border and a full-metal back cover, and it can also meet the requirements regarding the appearance of the user.

In a preferred embodiment, the invention provides a communications device that comprises a system ground plane, a signal source, a device frame, a magnetic conductive material and an antenna. The signal source is electrically coupled to the system ground plane. The device frame is perpendicular to the system ground plane. The antenna is electrically coupled to the signal source and is disposed on the device frame. The magnetic conductive material is disposed adjacent to the antenna but spaced apart by a first predetermined distance from the antenna. The magnetic line of force induced by the antenna is directed in a predetermined direction by the magnetic conductive material.

In some embodiments, the magnetic conductive material is directly connected to the system ground plane.

In some embodiments, the communications device further comprises a metal component disposed adjacent to the antenna but spaced a second predetermined distance away from the antenna. The magnetic conductive material is directly connected to the metal component.

In some embodiments, the communications device further comprises a metal component disposed adjacent to the antenna but spaced apart by a second predetermined distance from the antenna. The magnetic conductive material is disposed between the antenna and the metal component and the magnetic conductive material is not connected to the metal component.

In some embodiments, the magnetic conductive material is made of ferrite material.

In some embodiments, the permeability coefficient of the ferrite material is between 60~100 in the 0.5 GHz~6 GHz operating frequency band.

In some embodiments, the dielectric coefficient of the ferrite material is between 4~6 in the 0.5 GHz~6 GHz operating frequency band.

In some embodiments, the loss tangent of the ferrite material is between 0.003~0.02 in the 0.5 GHz~6 GHz operating frequency band.

In some embodiments, the communications device further comprises a full-metal back cover comprising the system ground plane and the device frame. The system ground plane and the device frame are formed as a single piece.

In some embodiments, the first predetermined distance is not less than 0.5 mm.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail below.

As discussed above, in recent years, there has been rising demand for narrow borders in electronic devices equipped with wireless communications functionality, such as mobile phones, notebook computers, and tablet PCs. If the antenna is disposed adjacent to metal components, the radiation area of the antenna must be increased, so as to ensure that antenna efficiency will not be affected by the metal components. However, since the important factors for modern communications devices include being thin, lightweight, and aesthetically pleasing, these factors limit the space available when designing the antenna. Therefore, in the limited design space available for the antenna, how to avoid the antenna performance being affected by adjacent metal components is a problem to be solved by the invention.

In the embodiment of the invention, a predetermined magnetic conductive material is introduced between the antenna and the metal components, so as to reduce the effect on the antenna efficiency and also increase freedom of designing the antenna. The proposed antenna structure can also be widely applied to communications devices the users of which are particular about the product's appearance, which include communications devices that use a full-metal back cover or a narrow-border design, so that the communications device can have both a beautiful appearance and good transmission performance. Here, the full-metal back cover communications device refers to a communications device with a back cover that is completely made of metal materials, and does not contain plastic materials.

Note that in a conventional communications device such as a notebook computer, plastic materials are generally used to generate a slit to facilitate the radiation of the antenna because a slot antenna is usually used in the back cover of notebook computers. Therefore, such a design does not belong to the scope of full-metal back cover communications devices. In order to avoid the influence of the plastic material on the metallic luster of the back cover, and also to avoid generating holes in the back cover, a demand for full-metal back cover devices has arisen.

In the proposed methods for designing antennas, by introducing the magnetic conductive material, not only the distance between the antenna and the other metal components in the communications device can be reduced, but also the transmission performance of the antenna can be maintained. Therefore, the proposed antenna-design methods are suitable for use in any communications device, especially those that need a full-metal back cover, a narrow border, or that are light, thin, and small.

Figure 1A:
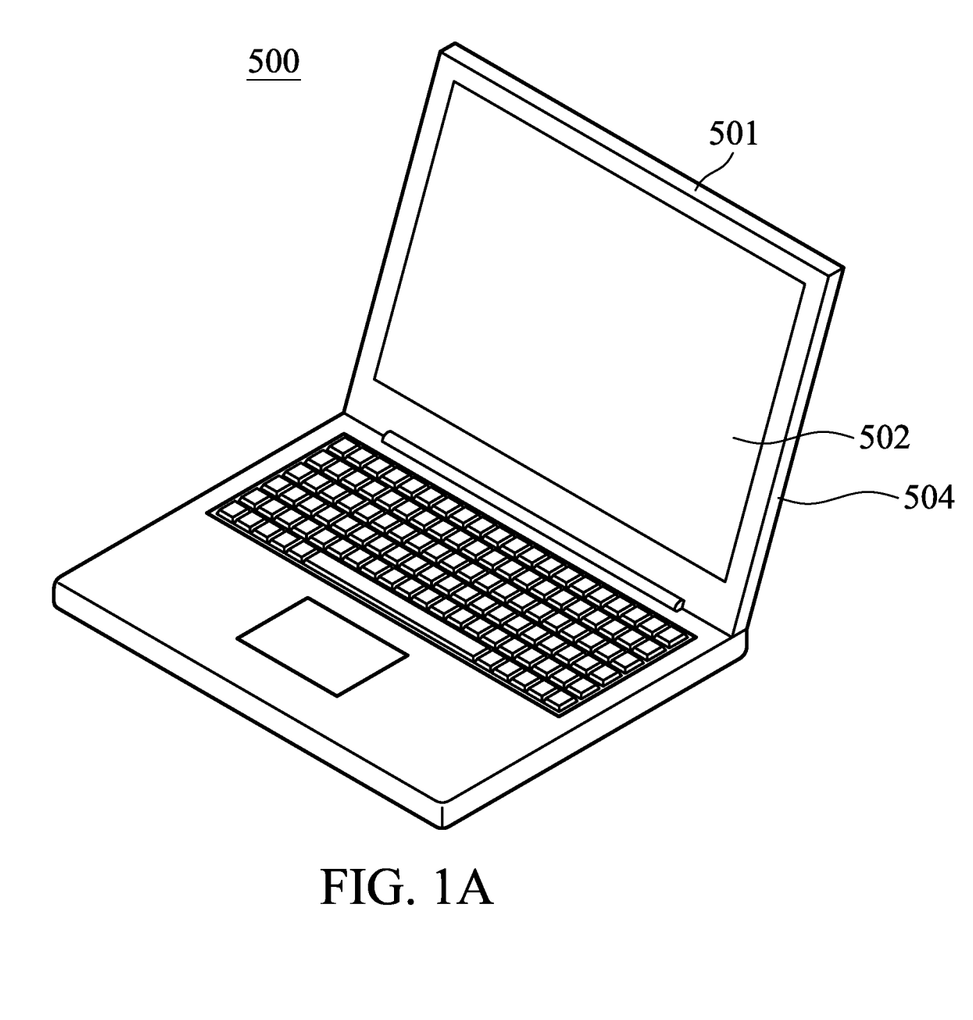
FIG. 1A is a diagram showing the exemplary appearance of a communications device according to an embodiment of the invention.
Figure 1B:
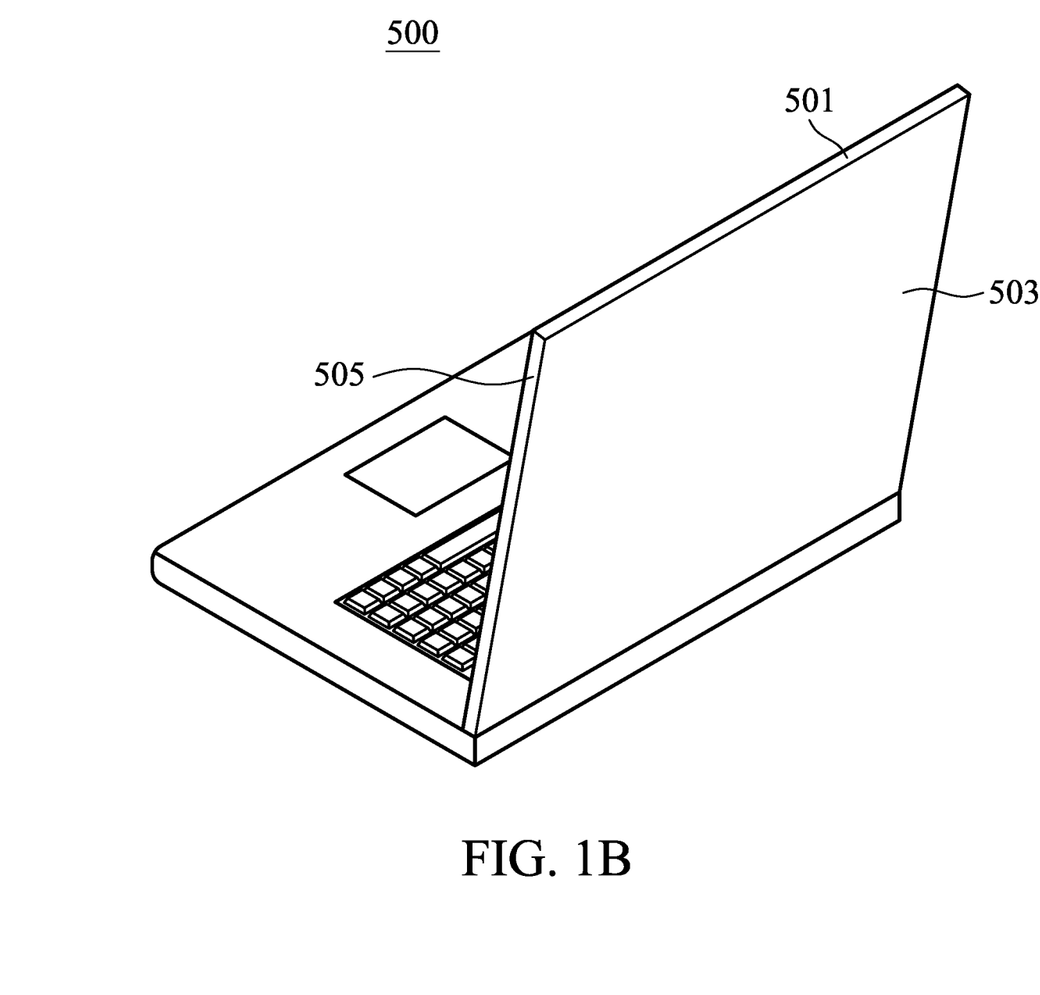
FIG. 1B is a diagram showing the exemplary appearance of a communications device according to an embodiment of the invention.

FIG. 1A and FIG. 1B are diagrams showing the exemplary appearance of a communications device according to an embodiment of the invention. Note that although a notebook computer is shown in the figures as an example of the communications device, the invention should not be limited thereto. As shown in FIG. 1A and FIG. 1B, the back cover area of the communications device 500 may be defined substantially by the top end 501, the front surface 502, the rear surface 503 and the lateral surfaces 504 and 505. The communications device 500 may comprise an LCD display module. Using a notebook computer as an example, the design of the back cover is usually liftable, such as a clamshell, and may comprise the LCD display panel of the LCD display module, and the LCD display panel is usually configured on the front surface 502.

When the communications device 500 powers up or is being used, the top end 501 generally faces upward to the sky. That is, facing toward the side opposite to where the pivot axis (not shown) connects the back cover to the host, so that the user can face the front surface 502. The top end 501, the rear surface 503, the lateral surfaces 504 and 505 and/or a portion of the front surface 502 of the metal housing form the device frames of the communications device 500. As discussed above, in the full-metal back cover design, the device frames are made of metal materials.

Figure 2:
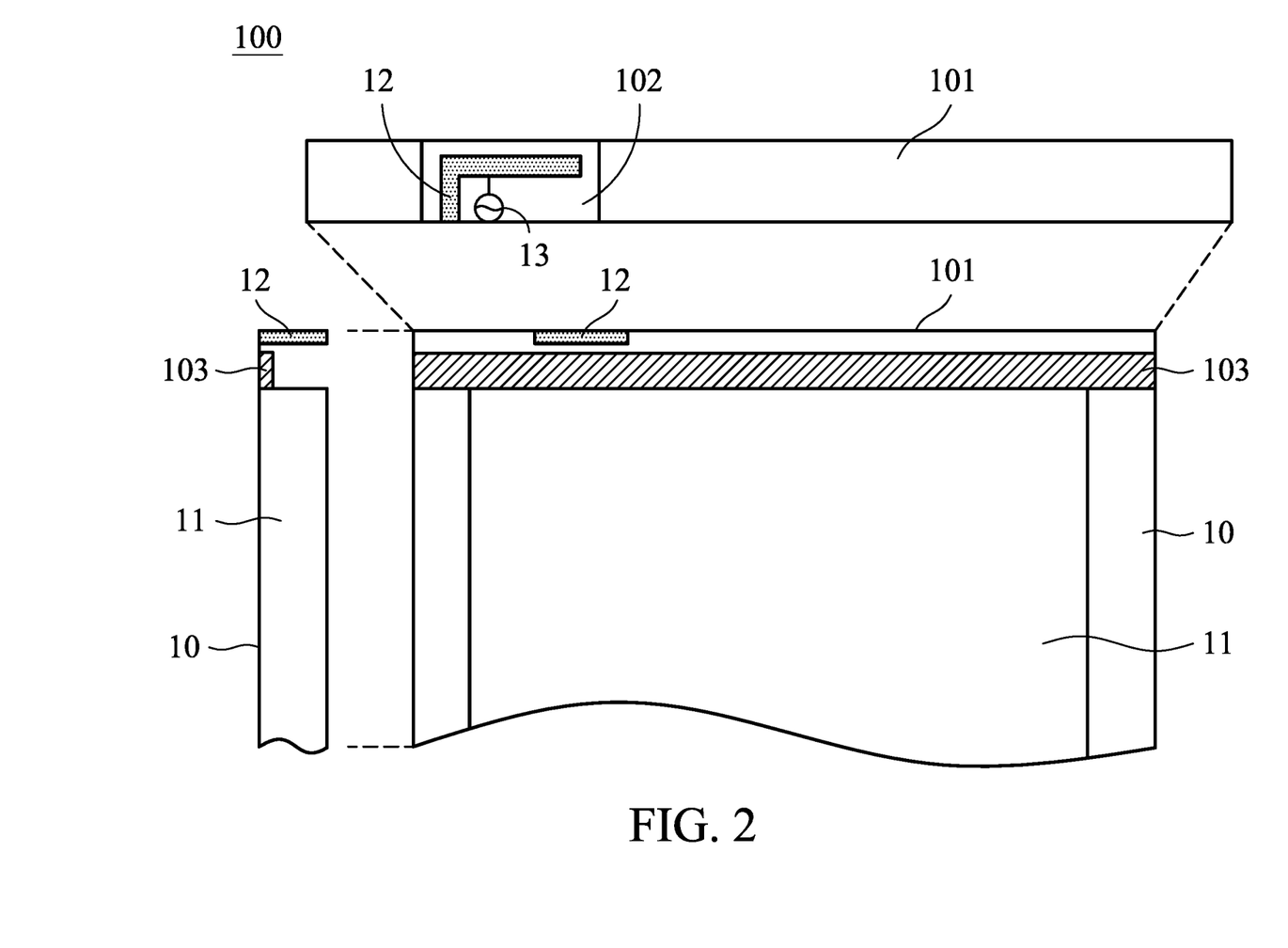
FIG. 2 is a diagram showing an exemplary antenna structure design according to a first embodiment of the invention.

FIG. 2 is a diagram showing an exemplary antenna structure design according to a first embodiment of the invention. FIG. 2 shows the front view (the main figure), the top view (shown above the main figure) and the side view (shown on the left of the main figure) of the communications device 100. The communications device 100 may comprise a system ground plane 10 and an antenna 12. The antenna 12 may be a monopole antenna, a dipole antenna, an inverted F-shaped antenna, a loop antenna, a slot antenna, or any other type of antenna, and the antenna 12 may further comprise a signal source 13 electrically coupled to the system ground plane 10. The antenna 12 may be disposed in the clearance region 102 of the device frame 101. The device frame 101 may be the top end of the communications device 500 shown in FIG. 1A and FIG. 1B, but it is not limited thereto. For example, the device frame 101 may also be disposed on the lateral surface of the communications device 500 shown in FIG. 1A and FIG. 1B. The system ground plane 10 may be the rear surface of the communications device 500 shown in FIG. 1A and FIG. 1B, but it is not limited thereto. The device frame 101 and the system ground plane 10 may be formed as a single piece, and the device frame 101 may be substantially perpendicular to the system ground plane 10.

The communications device 100 may further comprise a metal component 11. The metal component 11 is disposed adjacent to the antenna 12 but spaced apart by a predetermined distance, for example, not more than 3 mm, from the antenna 12. According to an embodiment of the invention, the thickness of the metal component 11 may be greater than or equal to the width of the antenna 12 (as shown in FIG. 2, the width of the antenna 12 in the longitudinal direction of the device frame 101), such that the vertical projection of the antenna 12 from the top end to the pivot axis (not shown) overlaps the metal component 11. According to an embodiment of the invention, the metal component 11 may be an LCD display module, an LCD display panel, a battery device, a camera module, a conductor structure, or another metal component of the communications device 100.

According to an embodiment of the invention, the communication device 100 may further comprise a magnetic conductive material 103. The magnetic conductive material 103 may be disposed adjacent to the antenna 12 but spaced apart by a predetermined distance, for example, not less than 0.5 mm, from the antenna 12. The magnetic conductive material 103 is provided so that the magnetic line of force induced by the antenna is directed in a predetermined direction by the magnetic conductive material 103. For example, the predetermined direction directing to the magnetic conductive material 103 (that is, the magnetic line of force is directed in a predetermined direction so that the distribution of the magnetic line of force can be concentrated around the magnetic conductive material 103, or the magnetic line of force is directed in a predetermined direction so that the distribution of the magnetic line of force can be away from the metal component 11).

Figure 3A:
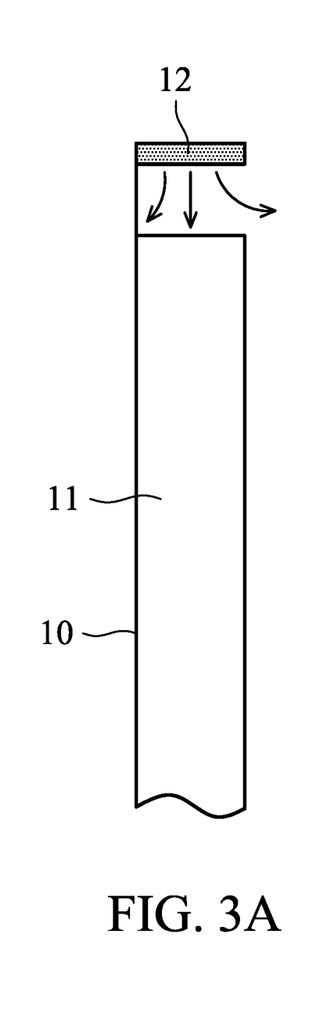
FIG. 3A is a diagram showing an exemplary distribution of the magnetic line of force induced by the antenna before introducing the magnetic conductive material.
Figure 3B:
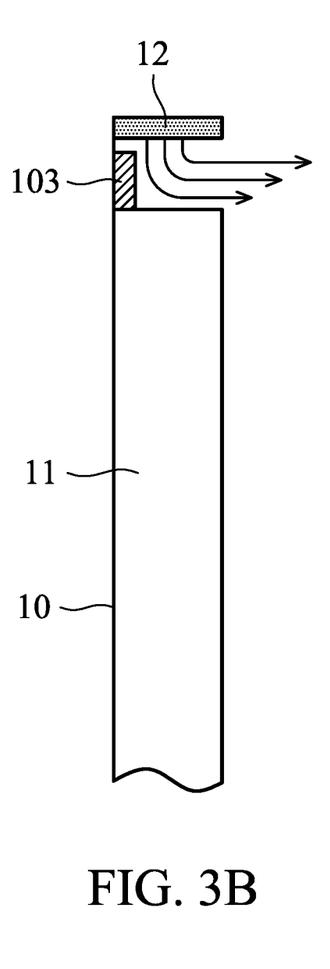
FIG. 3B is a diagram showing an exemplary distribution of the magnetic line of force induced by the antenna when the magnetic conductive material is included.

FIG. 3A is a diagram showing an exemplary distribution of the magnetic line of force induced by the antenna 12 before introducing the magnetic conductive material 103. FIG. 3B is a diagram showing an exemplary distribution of the magnetic line of force induced by the antenna 12 when the magnetic conductive material 103 is included. Before using the magnetic conductive material 103, the magnetic line of force induced by the antenna 12 will point to the metal component 11, and will be absorbed by the metal component 11. Therefore, the loss of the electromagnetic wave caused by the metal component 11 will seriously affect the transmission performance of the antenna.

According to an embodiment of the invention, after using the magnetic conductive material 103, the distribution of the magnetic line of force induced by the antenna 12 will be changed due to the high magnetic permeability of the magnetic conductive material 103, such that most of the magnetic line of force will be concentrated around the magnetic conductive material 103. For example, the magnetic line of force induced by the antenna 12 will be directed in the predetermined direction concentrated around the magnetic conductive material 103. Since most of the radiant energy will not be dissipated by the adjacent metal component, the antenna efficiency can be increased by about 10 to 15% in the 0.5 GHz~6 GHz operating frequency band when comparing with the case without the magnetic conductive material 103.

According to an embodiment of the invention, the magnetic conductive material 103 may be made of ferrite material. Table 1 shows the preferred parameters of the ferrite material in the 0.5 GHz~6 GHz operating frequency band in an embodiment of the invention. According to the embodiment of the invention, in the 0.5 GHz~6 GHz operating frequency band, the permeability coefficient of the ferrite material is preferably between 60~100 (80±20), the dielectric coefficient of the ferrite material is preferably between 4~6 (5±1), and the loss tangent of the ferrite material is preferably between 0.003~0.02. In addition, according to an embodiment of the invention, the thickness of the magnetic conductive material 103 may be 1±0.5 mm.

TABLE 1

Preferred parameters of the ferrite material in the 0.5 GHz~6 GHz operating frequency band

| Parameters | Preferred Value |
| --- | --- |
| Dielectric coefficient $\epsilon_r$ | 5 ± 1 |
| Permeability coefficient $\mu_r$ | 80 ± 20 |
| Loss tangent δ | 0.003~0.02 |

According to a first embodiment of the invention, the magnetic conductive material 103 may be a sheet structure (for example, the thickness is under 0.4 mm) or a 3-D structure, and may be attached to or disposed on the system ground plane 10 as shown in FIG. 2. In the embodiment shown in FIG. 2, since the magnetic conductive material 103 is disposed on the rear surface of the back cover region of the communications device 100, and the antenna 12 is disposed at the top end of the back cover region of the communications device 100, the magnetic conductive material 103 can be placed perpendicular to the antenna 12, as shown in the side view in FIG. 2. In addition, in the first embodiment of the invention, the magnetic conductive material 103 may be directly connected to the system ground plane 10, or the magnetic conductive material 103 and the system ground plane 10 may be not connected to each other, both of which can achieve the effect of changing the distribution of the magnetic line of force.

Note that in normal cases, for the radiation characteristics of the antenna 12 that is not affected by the adjacent metal component 11 at all, the distance between the two elements should be at least 0.25 times the corresponding wavelength, which is equivalent to 31 mm in the 2.4 GHz operating frequency band. However, in the embodiments of designing the antenna, the distance between the metal component 11 and the antenna 12 may be only 3 mm (which is about 0.03 times the corresponding wavelength), and the radiation characteristics of the antenna 12 will not be affected by such a short distance. Therefore, the proposed antenna-design methods are not only suitable for use in a communications device that needs a full-metal back cover, but they are also suitable for use in a communications device that has a narrow border. In addition, the antenna 12 may be disposed on the top end or the lateral surface, such that the antenna 12 does not occupy the circuit area on the main circuit board and can be highly integrated with the housing of the full-metal back cover.

Figure 4:
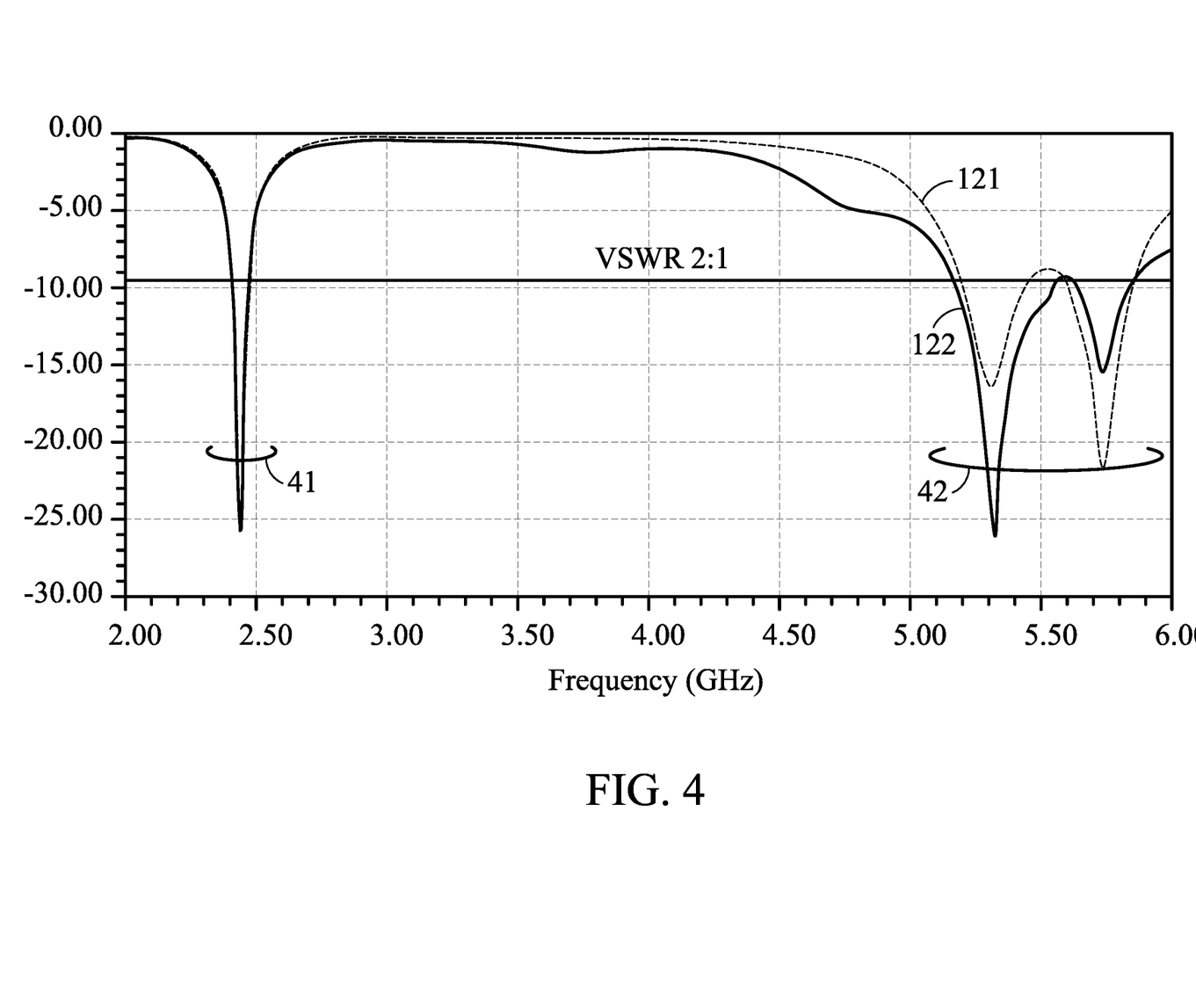
FIG. 4 is a diagram showing a first reflection coefficient curve 121 obtained according to an embodiment of the invention and a second reflection coefficient curve 122 without using the magnetic conductive material for comparison.

FIG. 4 is a diagram showing a first reflection coefficient curve 121 obtained according to an embodiment of the invention and a second reflection coefficient curve 122 without using the magnetic conductive material 103 for comparison. As shown in the figure, in the first frequency band 41 and the second frequency band 42, both the first reflection coefficient curve 121 and the second reflection coefficient curve 122 can have a reflection coefficient greater than the Voltage Standing Wave Ratio (VSWR) 2:1. Therefore, the requirements for the operating frequency band 2.4/5 GHz of WLAN can be met. The first reflection coefficient curve 121 is substantially similar to the second reflection coefficient curve 122, meaning that the proposed ferrite material parameter of the magnetic conductive material 103 has very tiny effect on the impedance matching of the antenna structure 12 in the first frequency band 41 and the second frequency band 42.

Figure 5:
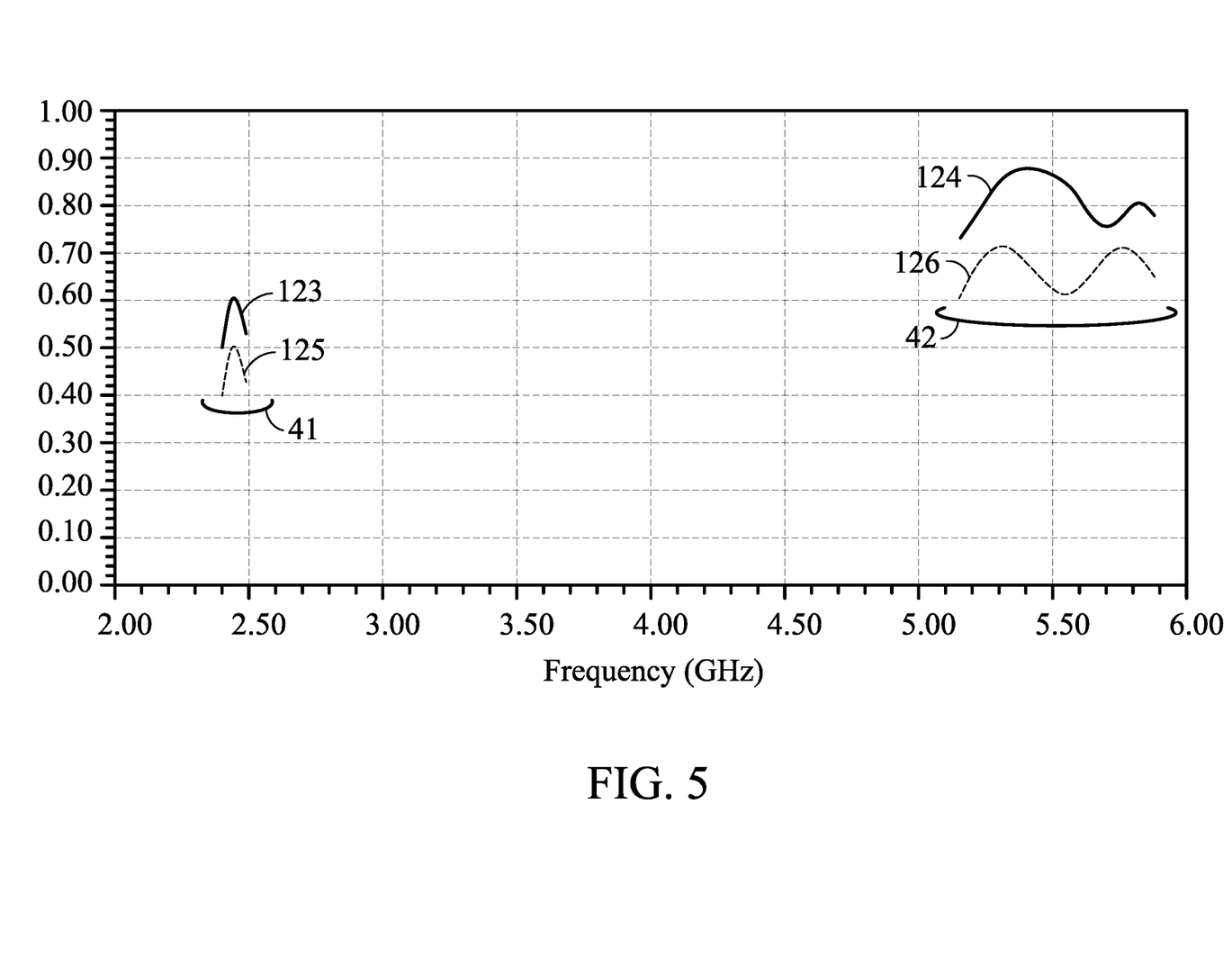
FIG. 5 is a diagram showing a first low frequency antenna efficiency curve 123 and a first high frequency antenna efficiency curve 124 obtained according to an embodiment of the invention and a second low frequency antenna efficiency curve 125 and a second high frequency antenna efficiency curve 126 without using the magnetic conductive material for comparison.

FIG. 5 is a diagram showing a first low frequency antenna efficiency curve 123 and a first high frequency antenna efficiency curve 124 obtained according to an embodiment of the invention and a second low frequency antenna efficiency curve 125 and a second high frequency antenna efficiency curve 126 without using the magnetic conductive material 103 for comparison. As shown in the figure, the first low frequency antenna efficiency curve 123 is above 50%, the second low frequency antenna efficiency curve 125 is above 40%, the first high frequency antenna efficiency curve 124 is above 70% and the second high frequency antenna efficiency curve 126 is above 60%. The result indicates that when introducing the magnetic conductive material 103, the antenna efficiency can be improved by about 10~15% in both the first frequency band 41 and the second frequency band 42, such that the radiation characteristics of the antenna 12 can be maintained even when the metal component 11 and the antenna 12 are placed adjacent to each other, which meets the requirements for actual application.

Figure 6:
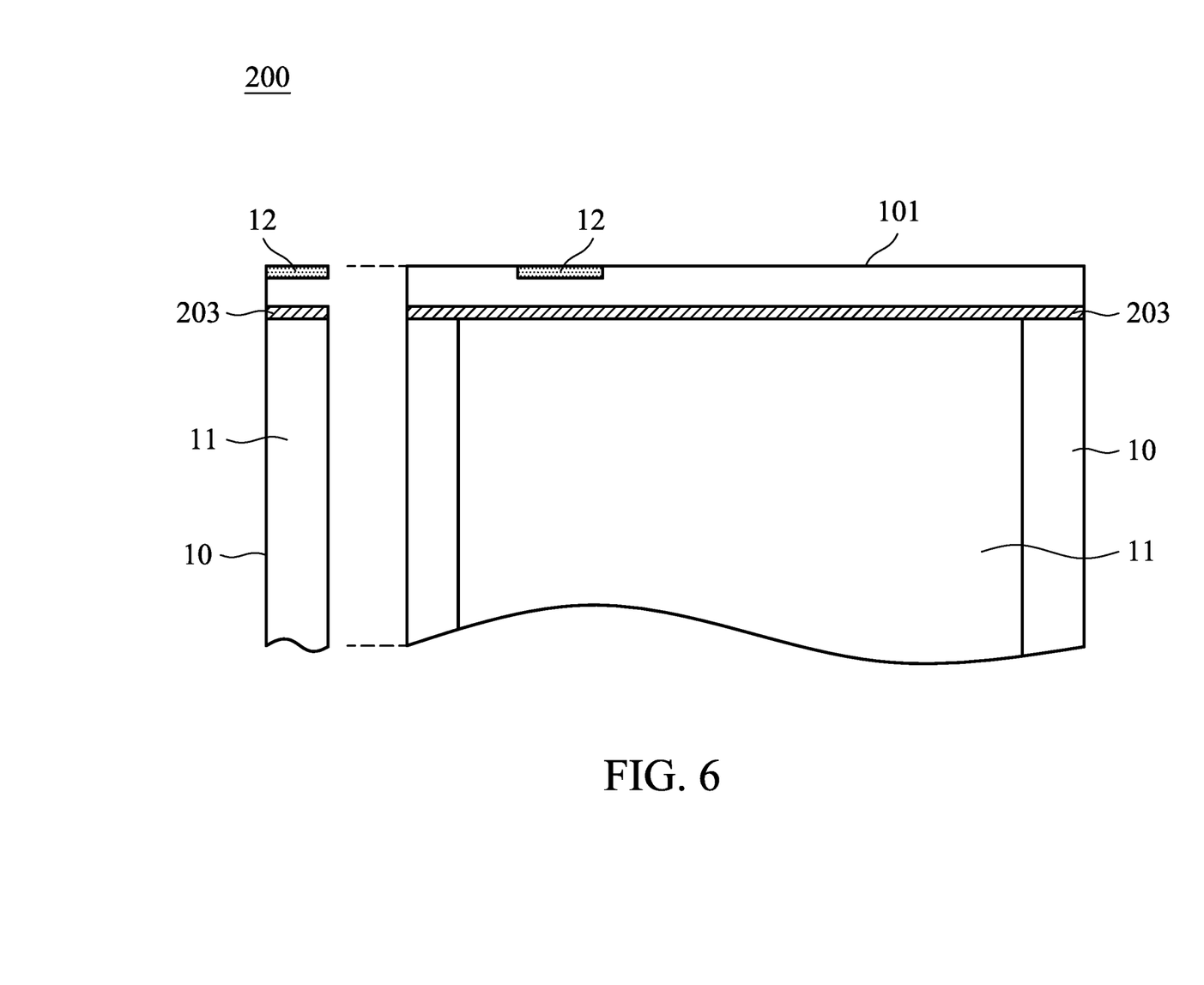
FIG. 6 is a diagram showing an exemplary antenna structure design according to a second embodiment of the invention.

FIG. 6 is a diagram showing an exemplary antenna structure design according to a second embodiment of the invention. FIG. 6 shows the front view (the main figure) and the side view (shown on the left of the main figure) of the communications device 200. The communications device 200 may comprise a system ground plane 10 and an antenna 12. The antenna 12 may be a monopole antenna, a dipole antenna, an inverted F-shaped antenna, a loop antenna, a slot antenna, or any other type of antenna, and the antenna 12 may further comprise a signal source electrically coupled to the system ground plane 10. The antenna 12 may be disposed on the device frame 101. The device frame 101 may be the top end of the communications device 200, but it is not limited thereto. The system ground plane 10 may be the rear surface of the communications device 200, but it is not limited thereto. The device frame 101 and the system ground plane 10 may be formed as a single piece, and the device frame 101 may be substantially perpendicular to the system ground plane 10.

The communications device 200 may further comprise a metal component 11. The metal component 11 is disposed adjacent to the antenna 12 but spaced apart by a predetermined distance, for example, not more than 3 mm, from the antenna 12. According to an embodiment of the invention, the thickness of the metal component 11 may be greater than or equal to the width of the antenna 12, such that the vertical projection of the antenna 12 from the top end to the pivot axis (not shown) overlaps the metal component 11. According to an embodiment of the invention, the metal component 11 may be an LCD display module, an LCD display panel, a battery device, a camera module, a conductor structure, or another metal component of the communications device 200.

According to an embodiment of the invention, the communication device 200 may further comprise a magnetic conductive material 203. The magnetic conductive material 203 may be disposed adjacent to the antenna 12 but spaced apart by a predetermined distance, for example, not less than 0.5 mm, from the antenna 12. The magnetic conductive material 203 is provided so that the magnetic line of force induced by the antenna 12 is directed in a predetermined direction by the magnetic conductive material 203. For example, the magnetic line of force is directed in a predetermined direction so that the distribution of the magnetic line of force can be concentrated around the magnetic conductive material 203.

In the second embodiment of the invention, the magnetic conductive material 203 may have a sheet structure (for example, the thickness is under 0.4 mm) or a 3-D structure, and may be attached to or disposed on the metal component 11 as shown in FIG. 6 and is not directly connected to the antenna 12. The magnetic conductive material 203 may be disposed in parallel with the antenna 12, as shown in the side view of FIG. 6. In addition, in the antenna design in the second embodiment of the invention, the magnetic conductive material 203 may be directly connected to the metal component 11, and the result of changing the distribution of the magnetic line of force can be achieved as the antenna design in the first embodiment of the invention.

Figure 7A:
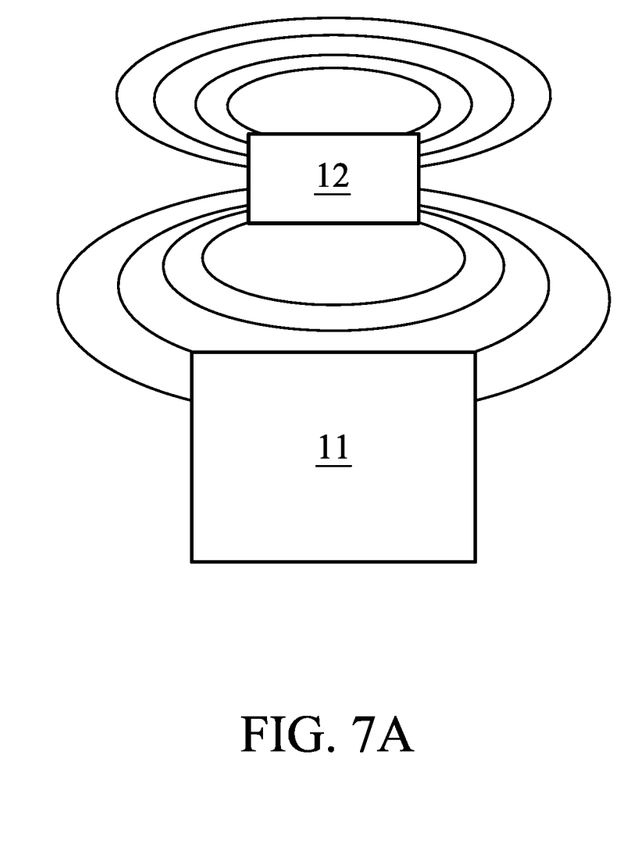
FIG. 7A is a diagram showing the exemplary distribution of the magnetic line of force induced by the antenna without the magnetic conductive material.
Figure 7B:
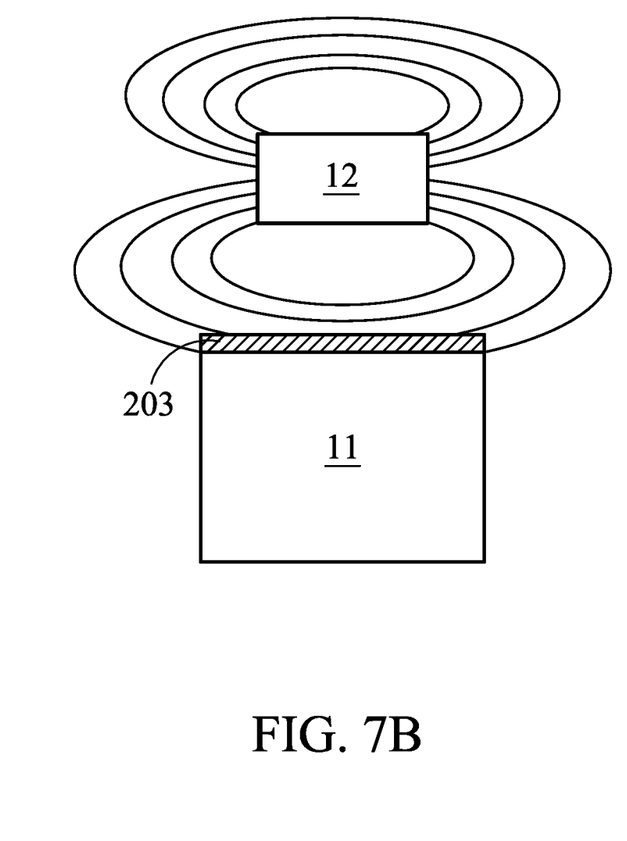
FIG. 7B is a diagram showing the exemplary distribution of the magnetic line of force induced by the antenna with the magnetic conductive material according to the second embodiment of the invention.

FIG. 7A is a diagram showing the exemplary distribution of the magnetic line of force induced by the antenna 12 without the magnetic conductive material 203. FIG. 7B is a diagram showing the exemplary distribution of the magnetic line of force induced by the antenna 12 with the magnetic conductive material 203 according to the second embodiment of the invention. Before introducing the magnetic conductive material 203, the magnetic line of force induced by the antenna 12 will point to the metal component 11, and will be absorbed by the metal component 11. Therefore, the loss of the electromagnetic wave caused by the metal component 11 will seriously affect the transmission performance of the antenna.

According to an embodiment of the invention, after using the magnetic conductive material 203, the distribution of the magnetic line of force induced by the antenna 12 will be changed due to the high magnetic permeability of the magnetic conductive material 203, such that the magnetic line of force induced by the antenna 12 will be guided by the magnetic conductive material 203 to point to the predetermined direction and will be limited in the non-metal region.

Figure 8:
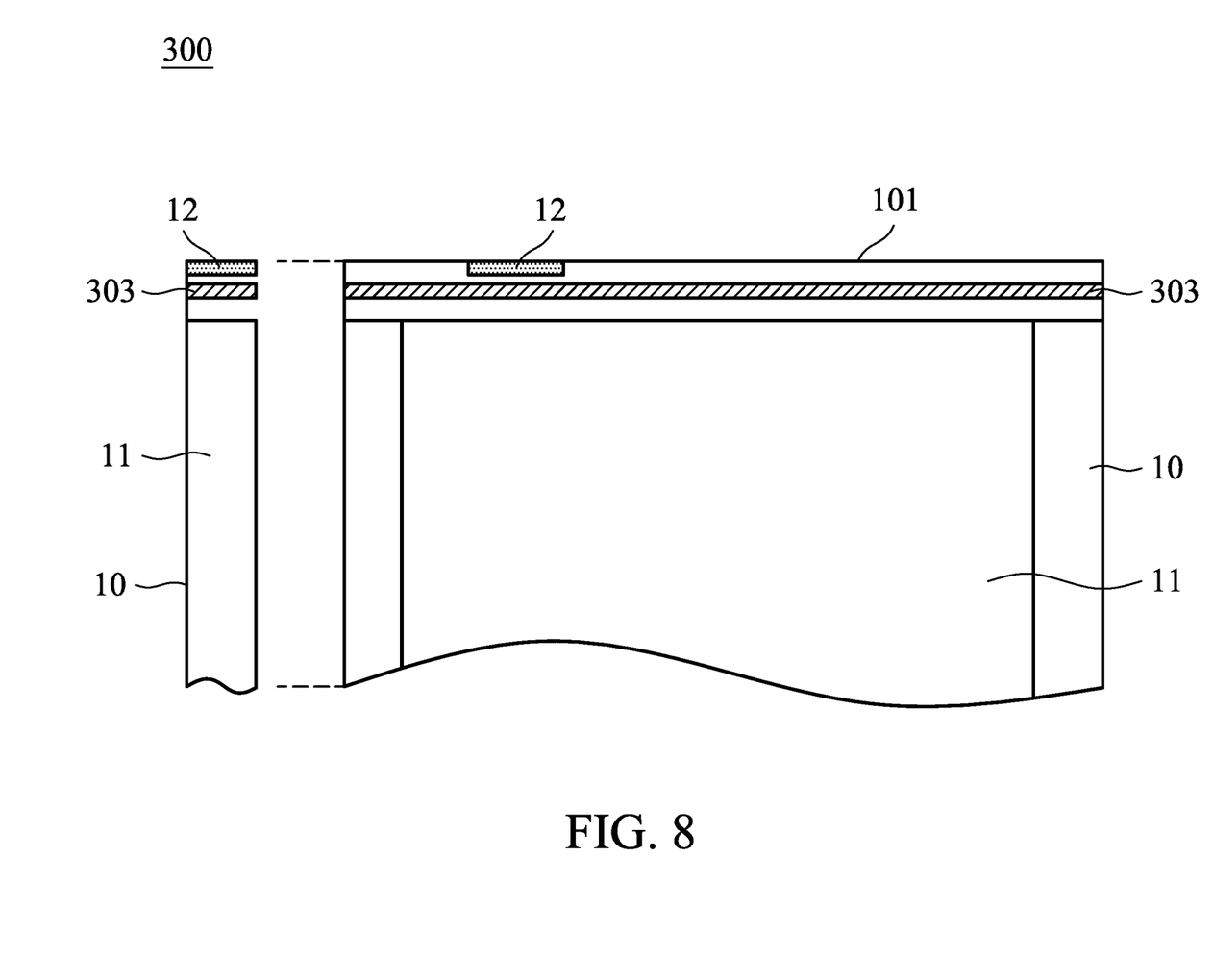
FIG. 8 is a diagram showing an exemplary antenna structure design according to a third embodiment of the invention.

FIG. 8 is a diagram showing an exemplary antenna structure design according to a third embodiment of the invention. FIG. 8 shows the front view (the main figure) and the side view (shown on the left of the main figure) of the communications device 300. The communications device 300 may comprise a system ground plane 10 and an antenna 12. The antenna 12 may be a monopole antenna, a dipole antenna, an inverted F-shaped antenna, a loop antenna, a slot antenna, or any other type of antenna, and the antenna 12 may further comprise a signal source electrically coupled to the system ground plane 10. The antenna 12 may be disposed on the device frame 101. The device frame 101 may be the top end of the communications device 300, but it is not limited thereto. The system ground plane 10 may be the rear surface of the communications device 300, but it is not limited thereto. The device frame 101 and the system ground plane 10 may be formed as a single piece, and the device frame 101 may be substantially perpendicular to the system ground plane 10.

The communications device 300 may further comprise a metal component 11. The metal component 11 is disposed adjacent to the antenna 12 but spaced apart by a predetermined distance, for example, not more than 3 mm, from the antenna 12. According to an embodiment of the invention, the thickness of the metal component 11 may be greater than or equal to the width of the antenna 12, such that the vertical projection of the antenna 12 from the top end to the pivot axis (not shown) overlaps the metal component 11. According to an embodiment of the invention, the metal component 11 may be an LCD display module, an LCD display panel, a battery device, a camera module, a conductor structure, or another metal component of the communications device 300.

According to an embodiment of the invention, the communication device 300 may further comprise a magnetic conductive material 303. The magnetic conductive material 303 may be disposed adjacent to the antenna 12 but spaced apart by a predetermined distance, for example, not less than 0.5 mm, from the antenna 12. The magnetic conductive material 303 is provided so that the magnetic line of force induced by the antenna 12 is directed in a predetermined direction by the magnetic conductive material 303. For example, the magnetic line of force is directed in a predetermined direction so that the distribution of the magnetic line of force can be concentrated around the magnetic conductive material 303.

In the third embodiment of the invention, the magnetic conductive material 303 may have a sheet structure (for example, the thickness is under 0.4 mm) or a 3-D structure, and may be disposed adjacent to the antenna 12 as shown in FIG. 8, such as being disposed between the antenna 12 and the metal component 11, but not directly connected to the antenna 12 and the metal component 11. The magnetic conductive material 303 may be disposed in parallel with the antenna 12, as shown in the side view of FIG. 8. In addition, in the antenna design in the third embodiment of the invention, the result of changing the distribution of the magnetic line of force can be achieved as the antenna design in the first embodiment of the invention.

Figure 9:
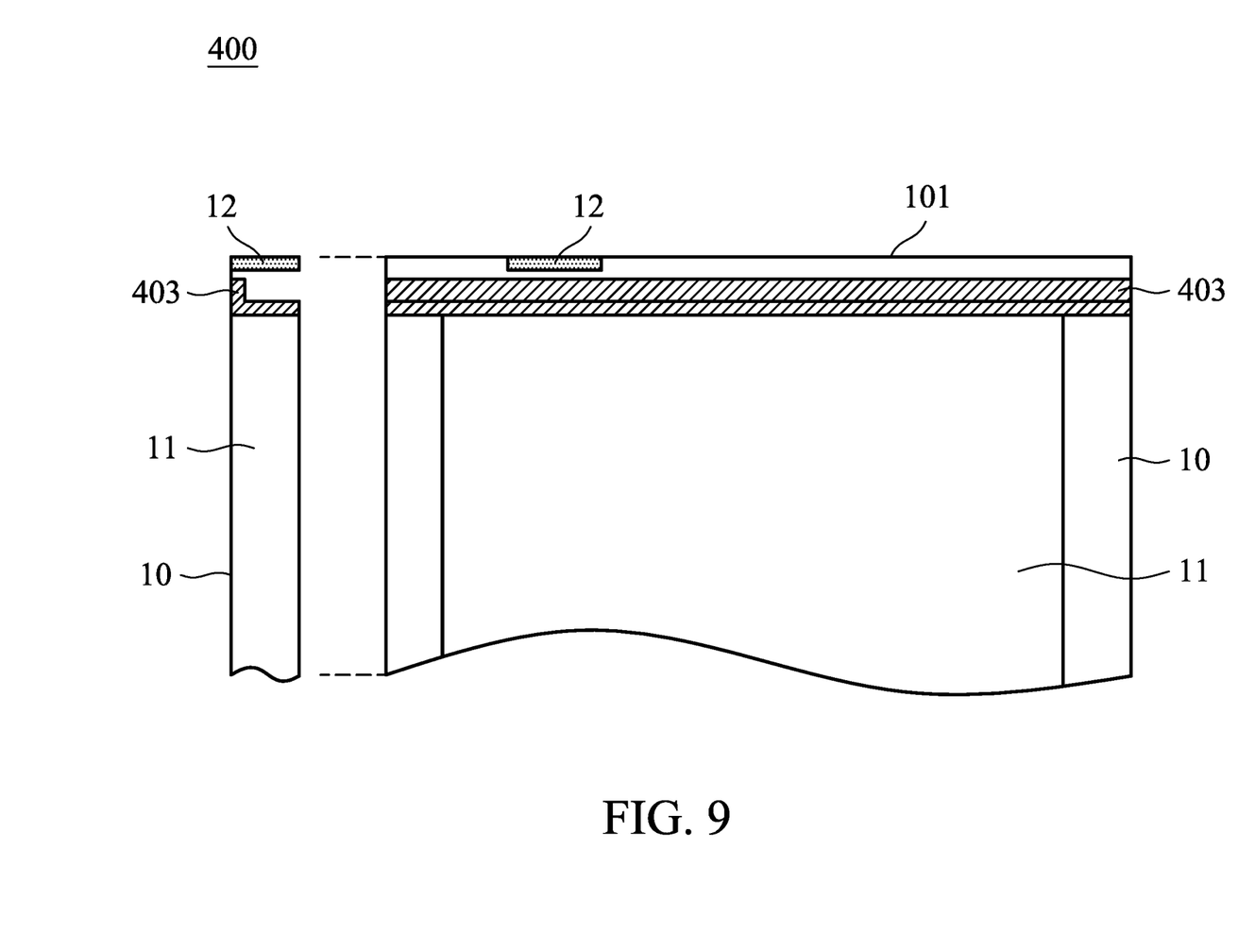
FIG. 9 is a diagram showing an exemplary antenna structure design according to a fourth embodiment of the invention.

FIG. 9 is a diagram showing an exemplary antenna structure design according to a fourth embodiment of the invention. FIG. 9 shows the front view (the main figure) and the side view (shown on the left of the main figure) of the communications device 400. The communications device 400 may comprise a system ground plane 10 and an antenna 12. The antenna 12 may be a monopole antenna, a dipole antenna, an inverted F-shaped antenna, a loop antenna, a slot antenna, or any other type of antenna, and the antenna 12 may further comprise a signal source electrically coupled to the system ground plane 10. The antenna 12 may be disposed on the device frame 101. The device frame 101 may be the top end of the communications device 400, but it is not limited thereto. The system ground plane 10 may be the rear surface of the communications device 400, but it is not limited thereto. The device frame 101 and the system ground plane 10 may be formed as a single piece, and the device frame 101 may be substantially perpendicular to the system ground plane 10.

The communications device 400 may further comprise a metal component 11. The metal component 11 is disposed adjacent to the antenna 12 but spaced apart by a predetermined distance, for example, not more than 3 mm, from the antenna 12. According to an embodiment of the invention, the thickness of the metal component 11 may be greater than or equal to the width of the antenna 12, such that the vertical projection of the antenna 12 from the top end to the pivot axis (not shown) overlaps the metal component 11. According to an embodiment of the invention, the metal component 11 may be an LCD display module, an LCD display panel, a battery device, a camera module, a conductor structure, or another metal component of the communications device 400.

According to an embodiment of the invention, the communication device 400 may further comprise a magnetic conductive material 403. The magnetic conductive material 403 may be disposed adjacent to the antenna 12 but spaced apart by a predetermined distance, for example, not less than 0.5 mm, from the antenna 12. The magnetic conductive material 403 is provided so that the magnetic line of force induced by the antenna 12 is directed in a predetermined direction by the magnetic conductive material 403. For example, the magnetic line of force is directed in a predetermined direction so that the distribution of the magnetic line of force can be concentrated around the magnetic conductive material 403.

In the fourth embodiment of the invention, the magnetic conductive material 403 may have a sheet structure (for example, the thickness is under 0.4 mm) or a 3-D structure, and may be attached to the system ground plane 10 and the metal component 11 as shown in FIG. 9, but is not directly connected to the antenna 12. In the antenna design in the fourth embodiment of the invention, the result of changing the distribution of the magnetic line of force can be achieved as the antenna design in the first embodiment of the invention.

As discussed above, in normal cases, for the radiation characteristics of the antenna 12 that is not affected by the adjacent metal component 11 at all, the distance between the two elements should be at least 0.25 times the corresponding wavelength, which is equivalent to 31 mm for the 2.4 GHz operating frequency band. However, in the embodiments of designing the antenna, the distance between the metal component 11 and the antenna 12 may be only 3 mm (which is about 0.03 times the corresponding wavelength), and the radiation characteristics of the antenna 12 will not be affected by such a short distance. Therefore, the proposed antenna-design methods are not only suitable for use in a communications device that needs a full-metal back cover, but they are also suitable for a communications device with a narrow border. In addition, the antenna 12 may be disposed on the top end or the lateral surface, such that the antenna 12 does not occupy the circuit area on the main circuit board and can be highly integrated with the housing of the full-metal back cover.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:
1. A communications device, comprising:
a system ground plane;
a signal source, electrically coupled to the system ground plane;
a device frame, perpendicular to the system ground plane;
a magnetic conductive material; and
an antenna, electrically coupled to the signal source and disposed on the device frame,
wherein the magnetic conductive material is disposed adjacent to the antenna but spaced apart by a first predetermined distance from the antenna, and wherein magnetic line of force induced by the antenna is directed in a predetermined direction by the magnetic conductive material;
wherein the communications device further comprises:
a metal component, disposed adjacent to the antenna but spaced apart by a second predetermined distance from the antenna,
wherein the magnetic conductive material is disposed between the antenna and the metal component and the magnetic conductive material is not connected to the metal component;

wherein a thickness of the metal component is greater than or equal to a width of the antenna, such that a vertical projection of the antenna from the antenna to the metal component overlaps the metal component.

2. The communications device as claimed in claim 1, wherein the magnetic conductive material is directly connected to the system ground plane.

3. The communications device as claimed in claim 1, wherein the magnetic conductive material is made of ferrite material.

4. The communications device as claimed in claim 3, wherein the permeability coefficient of the ferrite material is between 60~100 in the 0.5 GHz~6 GHz operating frequency band.

5. The communications device as claimed in claim 3, wherein the dielectric coefficient of the ferrite material is between 4~6 in the 0.5 GHz~6 GHz operating frequency band.

6. The communications device as claimed in claim 3, wherein the loss tangent of the ferrite material is between 0.003~0.02 in the 0.5 GHz~6 GHz operating frequency band.

7. The communications device as claimed in claim 1, further comprising:
   a full-metal back cover, comprising the system ground plane and the device frame, wherein the system ground plane and the device frame are formed as a single piece.

8. The communications device as claimed in claim 1, wherein the first predetermined distance is not less than 0.5 mm.

* * * * *